(12) United States Patent
Lee et al.

(10) Patent No.: US 6,930,502 B2
(45) Date of Patent: Aug. 16, 2005

(54) METHOD USING CONDUCTIVE ATOMIC FORCE MICROSCOPY TO MEASURE CONTACT LEAKAGE CURRENT

(75) Inventors: Jon C. Lee, Hsin-Chu (TW); Jung-Hsiang Chuang, Hsin-Chu (TW)

(73) Assignee: Taiwan Semiconductor Manufacturing Co., Ltd., (TW)

( * ) Notice: Subject to any disclaimer, the term of this patent is extended or adjusted under 35 U.S.C. 154(b) by 0 days.

(21) Appl. No.: 10/734,020

(22) Filed: Dec. 10, 2003

(65) Prior Publication Data

US 2005/0127926 A1   Jun. 16, 2005

(51) Int. Cl.[7] ............................................. G01R 31/02
(52) U.S. Cl. .................................................... 324/765
(58) Field of Search .................... 438/17, 14; 324/765, 324/754, 762, 549, 525, 522, 500, 718, 719, 324/724

(56) References Cited

U.S. PATENT DOCUMENTS

| | | | |
|---|---|---|---|
| 5,585,734 A | * 12/1996 | Meuris et al. | ............... 324/719 |
| 6,043,672 A | 3/2000 | Sugasawara | |
| 6,147,507 A | * 11/2000 | Shabde et al. | ............... 324/766 |
| 6,313,656 B1 | 11/2001 | Schaffroth et al. | |
| 2003/0057988 A1 | * 3/2003 | Maeda et al. | ............... 324/765 |

OTHER PUBLICATIONS

B. El-Kareh, Introduction to VLSI Silicon Devices, pp. 93.*

* cited by examiner

Primary Examiner—Olik Chaudhuri
Assistant Examiner—Belur Keshavan
(74) Attorney, Agent, or Firm—Duane Morris LLP

(57) ABSTRACT

A method for measuring current leakage of a contact of a semiconductor device formed on or in a substrate, includes scanning the contact with a probe of a conductive atomic force microscope; applying a DC voltage between the substrate and a conductive tip of the probe; and measuring a value of a current passing through the contact to the substrate, in response to the applied DC voltage.

18 Claims, 4 Drawing Sheets

METHOD USING CONDUCTIVE ATOMIC FORCE MICROSCOPY TO MEASURE CONTACT LEAKAGE CURRENT

FIELD OF INVENTION

The present invention relates to integrated circuit defect detection and failure analysis. More specifically, the present invention relates to a method that utilizes conductive atomic force microscopy to measure the contact leak current of a semiconductor device.

BACKGROUND OF THE INVENTION

Semiconductor devices have source/drain regions and gate electrodes connected to metal wirings by contact structures. A typical contact structure may be fabricated by forming an interlayer insulating film composed for example, of $SiO_2$, over the semiconductor device and selectively removing a portion of the insulating film to form a contact hole. A metal composite film composed, for example, of titanium (Ti), titanium nitride (TiN) and aluminum (Al) are successively deposited on the surface of the contact hole. After that, the contact hole is filled with a metal, such as tungsten to complete the contact.

During contact fabrication, the Ti film reacts with silicon atoms of the source/drain region or gate electrode during a heating process after deposition to form a silicide which serves to decrease the contact resistance between the source/drain region or gate electrode. The TiN film serves as an anti-diffusion film to prevent mutual movement of silicon atoms and aluminum atoms. The Al film constitutes a main body of the metal wiring and serves to conduct an electric current at a low resistance.

Sometimes, during the contact fabrication process, defective contacts are produced. The defective contacts are often characterized by larger leak currents. The larger leak currents may also be due to defects in the structures of the semiconductor device, such as the gate oxide. Hence, defective contacts and/or device structures may be distinguished from normal contacts and device structures by measuring contact current leakage.

Unfortunately, conventional defect detecting techniques, such as voltage contrast (VC) on a scanning electron microscope (SEM), can not distinguish between the micro-current leakage of normal and defective contacts and/or device structures. Moreover, the submicron size of the contact structures makes it impossible to use traditional probing techniques to measure the contact leak current.

Accordingly, a method is needed for measuring contact leak current of semiconductor device contacts to distinguish between the micro-current leakage of normal and defective contacts and/or device structures.

SUMMARY OF THE INVENTION

A method for measuring current leakage of a contact of a semiconductor device formed on or in a substrate, the method comprising the steps of: scanning the contact with a probe of a conductive atomic force microscope; applying a DC voltage between a substrate of the semiconductor device and a conductive tip of the probe; and measuring a value of a tunneling current passing through the contact to the substrate, in response to the applied DC voltage.

DETAILED DESCRIPTION OF THE INVENTION

The present invention is a method for measuring the current leakage (tunneling current) of a contact of a semiconductor device at the nano-ampere level and lower current levels, such as pico-ampere level. This is accomplished in the present invention with conductive atomic force microscopy. The ability to measure the micro-current leakage of a contact allows for high resolution and high sensitivity current mapping of the contact, i.e., current leakage versus applied voltage curve (I/V curve). The resolution and sensitivity of this current mapping is much better than in conventional methods, such as voltage contrast performed on a SEM. Furthermore, the method of the present invention provides a better understanding about the relationship between an abnormal contact and its adjacent contacts through their I/V curves. In addition, the detailed data obtain with the method of the invention allows for the implementation of an appropriate physical failure analysis technology to identify the fabrication process that caused the failure.

Conductive-atomic force microscopy is an extension of atomic force microscopy. In atomic force microscopy, an atomic force microscope (AFM) is used to measure the surface topography or other property of a sample. The AFM has a probe with a tip that is placed on or immediately adjacent to the surface of the sample. The tip, which can be made from a ceramic or semiconductor material, such as single crystal silicon, is typically disposed at the end of a cantilever beam, which may also be made from a semiconductor material, such as single crystal silicon. An image of the sample is acquired by moving the tip over the sample, in a manner that is similar to the way a phonograph stylus scans a record, to measure the hills and valleys of the sample's surface. As the tip scans the sample, the tip is attracted to or repelled by the surface thereof, which causes the cantilever beam to deflect. The magnitude of beam's deflection may be monitored by a laser that reflects an angled beam of light off the tip end of the beam. The reflected beam of light may be detected by some type of position sensitive photodetector, which detects the position of the reflected laser light. A computer may be used to process the position information generated by the detector, to indicate the angular deflection of the cantilever.

Figure 1:
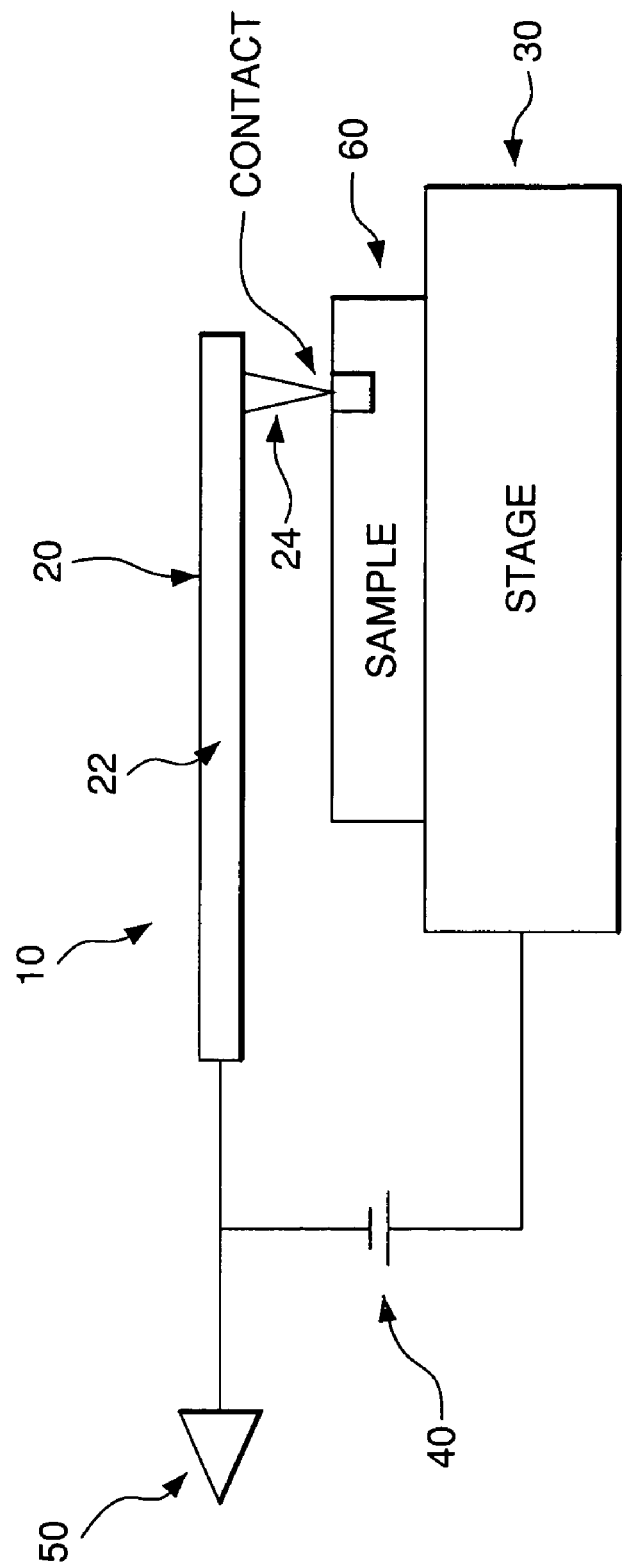
FIG. 1 is a schematic illustration of an embodiment of a conductive atomic force microscope used in the method of the present invention.

As shown in FIG. 1, the conductive-atomic force microscopy process of the method of the present invention uses a conductive atomic force microscope (C-AFM) 10 comprising a probe 20 formed by a cantilever beam 22 and a conductive tip 24 disposed at an end of the beam 22. The cantilever beam 22 may be made from a semiconductor material, such as single crystal silicon. The conductive tip 24 may be made from a semiconductor material, such as single crystal silicon, which is coated with a conductive film including without limitation, a metal film or a diamond film. The C-AFM 10 also has a holder 30 for mounting a sample, i.e., a chip or substrate 60 (including without limitation a silicon substrate for example) having contacts and/or semiconductor devices to be measured according to the present invention. A DC voltage source 40 applies a DC voltage between the substrate 60 and the conductive tip 24 of the probe 20. A linear current amplifier 50 is provided for sensing a tunneling current passing through a semiconductor device of the substrate 60. Linear current amplifier 50 can be any other device that substantially serves the same function of linear current amplifier 50.

Figure 2:
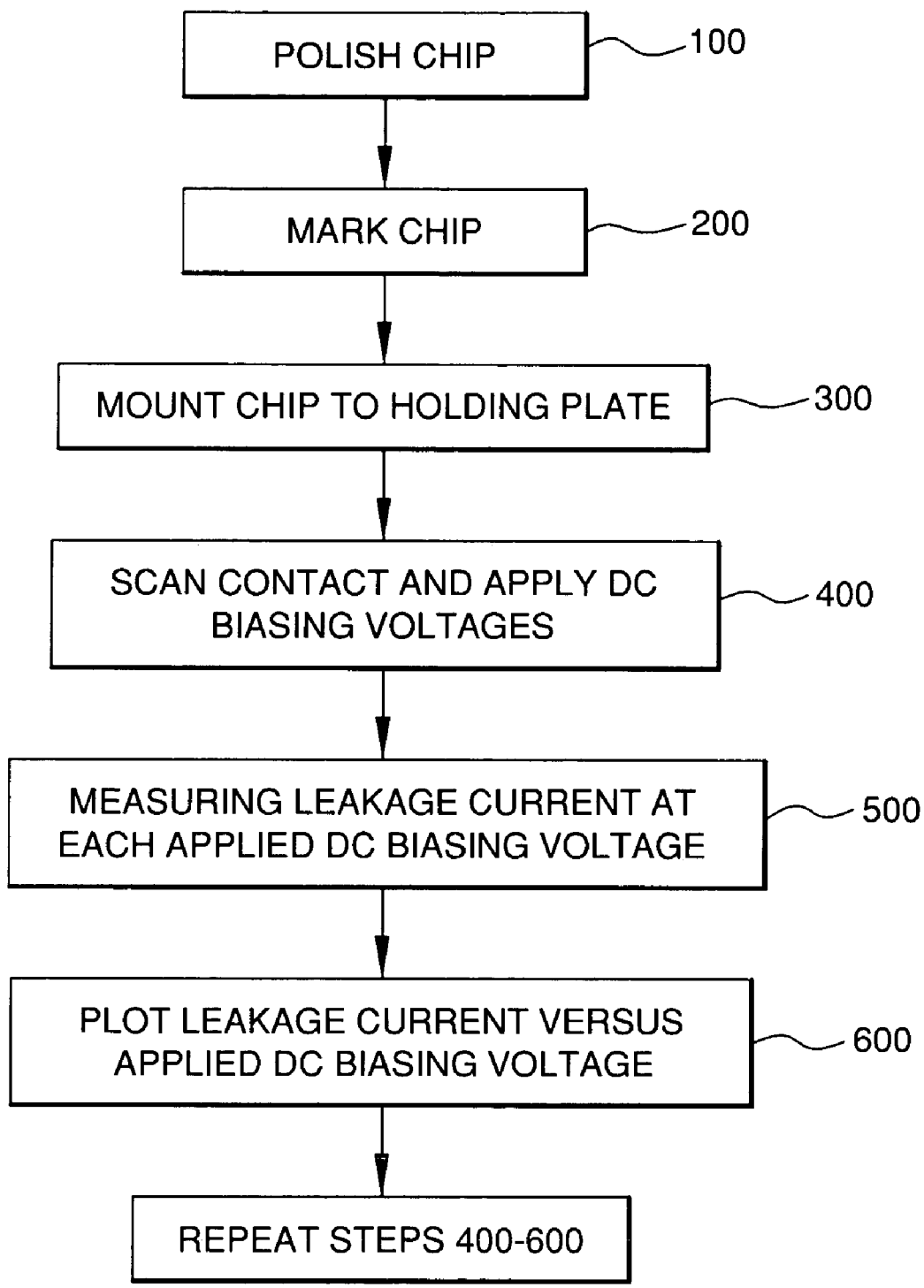
FIG. 2 is a flow chart of the method of the present invention.

Referring now to FIG. 2, there is shown a flow chart that lists the steps of the method of the present invention. Step 100 of the method comprises polishing the front and back sides of a semiconductor substrate 60 to be measured according to the method of the present invention. The front side of the substrate 60 should be polished down to the contact or metal layer such that oxidation is removed from the surface of the contact. The front and back sides of the substrate 60 can be polished using any semiconductor substrate polishing method.

Step 200 of the method comprises marking a site of interest (e.g. a fail site) of the substrate. This can be accomplished using a tester or localization instrument, such as an emission microscope for multiplayer inspection (EMMI) or an optical beam induced resistance change (OBIRCH) apparatus. One skilled in the art will recognize that other marking instruments may also be used and that the choice of the marking instrument to be used will depend, among other considerations, on its application. Marking can be accomplished using a focused ion beam, which uses an ion surface to mill the substrate 60, and a laser.

Step 300 of the method comprises attaching the substrate 60 to the holding plate of the C-AFM 10 of FIG. 1, by bonding the back side of the substrate 60 to the holding plate 30 using a conductive adhesive.

Step 400 of the method comprises placing the probe tip 24 of the C-AFM 10 against the front side of the substrate 60 and scanning the contact with the probe 20 of the C-AFM 10 while applying a plurality of different DC voltages between the substrate 60 and the tip 24 of the probe 20 with the DC power source. The force of the tip against the surface of the substrate 60 should be maintained at a constant value during scanning.

Step 500 of the method comprises measuring the values of the current flow passing from the probe tip 24, through the contact and the substrate of the chip 60, to the holding plate 30 (FIG. 1) at each different applied DC biasing voltage.

Step 600 of the method comprises generating a graph which plots the measured values of the tunneling current versus the corresponding values of the applied DC biasing voltages for the specified or suspected contacts (I/V curves).

Step 700 of the method, which may be optionally performed, comprises repeating steps 400–600 for one or more contacts adjacent to contact of the failed site. This step clarifies whether the failed contact has shorted to an adjacent contact or contacts.

Figure 3:
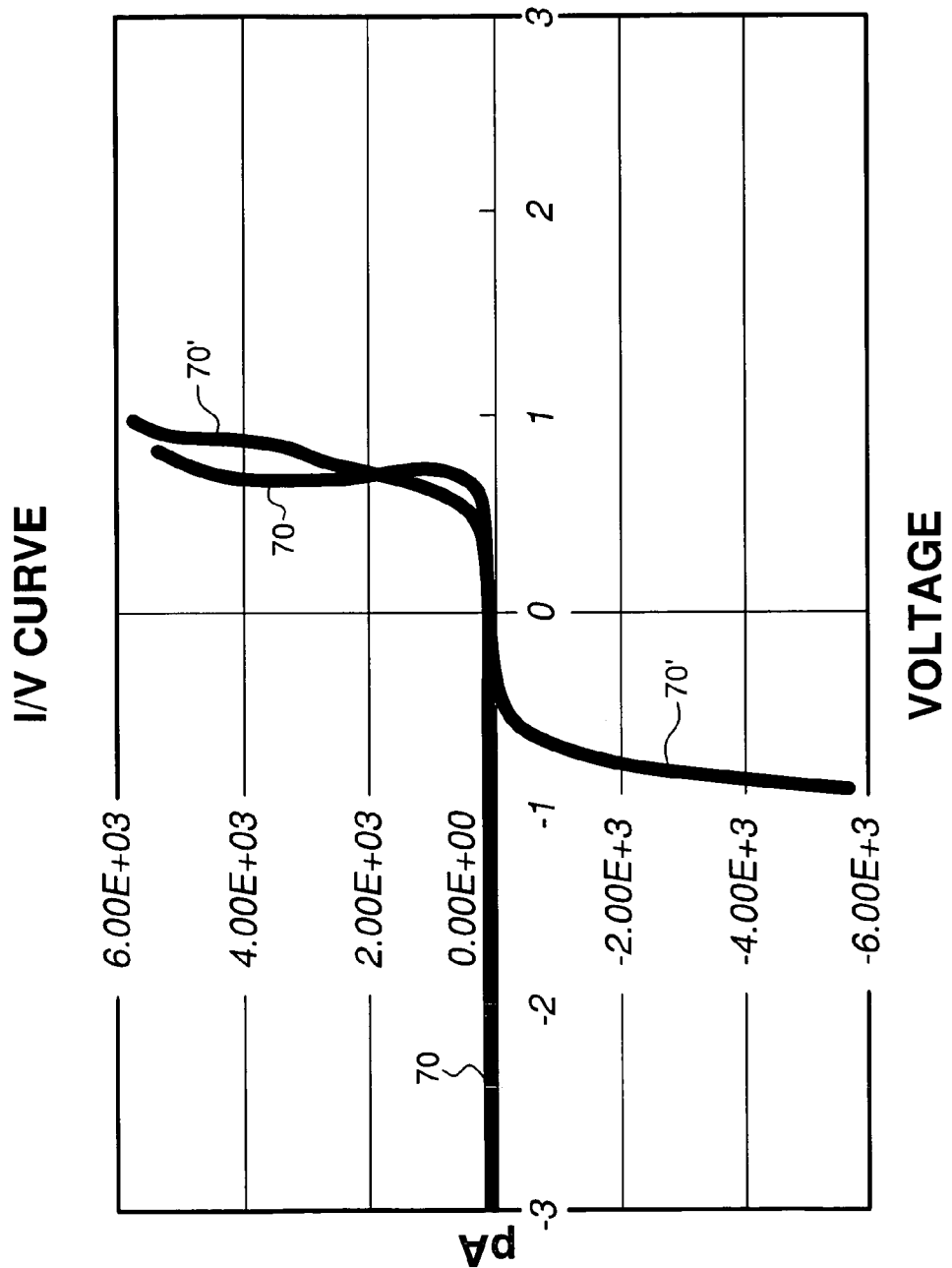
FIG. 3 is a graph plotting current versus applied voltage curve of a normal N+ contact and a defective N+ contact.

Primary electrical results can be obtained from the I/V curves generated by the method of the present invention. FIG. 3 shows I/V curves (current I forming the y-axis and ranging between –6000 picoamps and +6000 picoamps and voltage V forming the x-axis and ranging between –3 and +3 volts) of normal and defective N+ contacts, where curve 70 is the I/V curve of a normal N+ contact and curve 70' is the I/V curve of a defective N+ contact. As can be seen, curve 70' has a higher tunneling current at a negative voltage bias than curve 70, which indicates that the contact corresponding to curve 70' has some type of defect.

Figure 4:
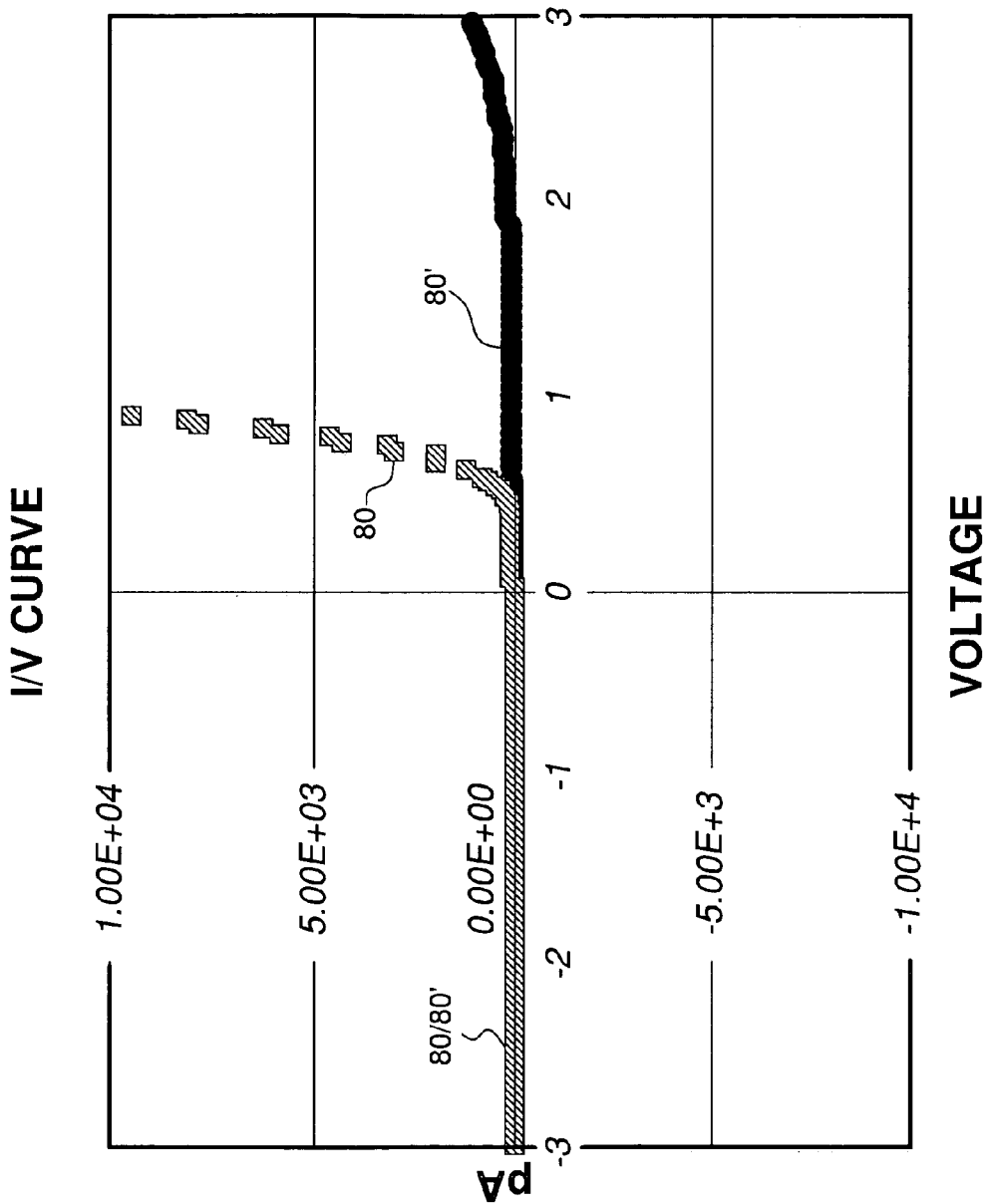
FIG. 4 is a graph plotting current versus applied voltage curve of a normal gate poly contact of a dual gate electrode which controls NMOS and PMOS semiconductor devices and a defective gate poly contact of the dual gate electrode.

FIG. 4 shows I/V curves (current I forming the y-axis and ranging between –10,000 picoamps and +10,000 picoamps and voltage V forming the x-axis and ranging between –3 and +3 volts) of normal and defective gate poly contacts of a dual gate electrode which controls NMOS and PMOS semiconductor devices. I/V curve 80 shows the normal gate poly contact of the dual gate electrode and I/V curve 80' shows the defective gate poly contact of the dual gate electrode. As is well known in the art, a gate oxide layer is disposed between each gate poly and the substrate. The contact associated with curve 80 requires a higher bias voltage to generate a tunneling current through the gate oxide layer from the gate poly to the substrate than the contact associated with curve 80'. This may be the result of a pin hole in the gate oxide layer disposed on the NMOS region, or the result of a thinner than normal, gate oxide layer disposed on the NMOS region. Either one of these gate oxide layer defects would allow a tunneling current to appear at a lower positive bias voltage, as shown in FIG. 4 by curve 80'.

As demonstrated in FIGS. 3 and 4, the ability to measure the micro-current leakage of a contact via conductive atomic force microscopy, allows for high resolution and high sensitivity current mapping of semiconductor device contacts not possible with conventional methods, such as voltage contrast performed on a SEM. Furthermore, the method of the present invention provides a better understanding about the relationship between an abnormal contact and its adjacent contacts through their I/V curves and allows for the implementation of an appropriate physical failure analysis technology to identify the fabrication process that caused the failure.

While the foregoing invention has been described with reference to the above embodiments, various modifications and changes can be made without departing from the spirit of the invention. Accordingly, such modifications and changes are considered to be within the scope of the appended claims

What is claimed is:

1. A method for measuring current leakage of a contact of a semiconductor device formed on or in a substrate, the method comprising the steps of:

scanning the contact with a probe having an electrically conductive tip;

applying a DC voltage between the substrate and the tip of the probe; and measuring a value of a current passing through the contact to the substrate, in response to the applied DC voltage;

wherein the DC voltage applied to between the substrate and the tip of the probe during the voltage applying step is varied among at least two values, and the measuring step includes measuring the value of the tunneling current at each value of the applied DC voltage.

2. The method according to claim 1, further comprising the step of exposing the contact of the semiconductor device prior to the scanning step.

3. The method according to claim 2, wherein the contact is known to be defective.

4. The method according to claim 2, further comprising the step of attaching the substrate to a holder prior to the scanning step.

5. The method according to claim 4, further comprising the step of marking the contact prior to the attaching step.

6. The method according to claim 5, wherein the contact is known to be defective.

7. The method according to claim 1, further comprising the step of plotting the values of the tunneling current against the values of the applied voltage.

8. The method according to claim 7, further comprising the step of using the plot generated in the plotting step to identify one of a defective contact and a defective semiconductor structure.

9. The method according to claim 1, wherein the measuring step is performed with a linear current sense amplifier.

10. A method for measuring semiconductor contact current leakage, the method comprising the steps of:

scanning a surface of a substrate having a plurality of semiconductor contacts with a probe of a conductive atomic force microscope, the probe having an electrically conductive tip;

applying a DC voltage between the substrate and the tip of the probe as the probe scans the surface of the substrate; and measuring a value of a current passing through each of the contacts, in response to the applied DC voltage;

wherein the DC voltage applied between the substrate and the tip of the probe in the voltage applying step is varied among at least two values, and for each of the contacts, the measuring step includes measuring the value of the tunneling current at each value of the applied DC voltage.

11. The method according to claim 10, further comprising the step of exposing the contacts prior to the scanning step.

12. The method according to claim 11, wherein at least one of the contacts is known to be defective.

13. The method according to claim 11, further comprising the step of attaching the substrate to a holder prior to the scanning step.

14. The method according to claim 13, further comprising the step of marking the contacts prior to the attaching step.

15. The method according to claim 13, wherein at least one of the contacts is known to be defective and further comprising the step of marking the at least one contact known to be defective prior to the attaching step.

16. The method according to claim 10, further comprising the step of plotting the values of the tunneling current against the values of the applied voltage.

17. The method according to claim 16, further comprising the step of using the plot generated in the plotting step to identify one of a defective contact and a defective semiconductor structure.

18. The method according to claim 10, wherein the measuring step is performed with a linear current sense amplifier.

* * * * *